(12) United States Patent
Takei

(10) Patent No.: US 11,643,029 B2
(45) Date of Patent: May 9, 2023

(54) AUTONOMOUS DRIVING DEVICE MODULE MOUNTING STRUCTURE AND AUTONOMOUS DRIVING ELECTRIC VEHICLE

(71) Applicant: Toyota Jidosha Kabushiki Kaisha, Toyota (JP)

(72) Inventor: Kenta Takei, Ichinomiya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 136 days.

(21) Appl. No.: 16/671,765

(22) Filed: Nov. 1, 2019

(65) Prior Publication Data
US 2020/0148136 A1    May 14, 2020

(30) Foreign Application Priority Data
Nov. 12, 2018 (JP) ............... JP2018-212533

(51) Int. Cl.
| | | |
|---|---|---|
| B60R 16/03 | (2006.01) |
| H05K 7/20 | (2006.01) |
| B60R 16/023 | (2006.01) |
| B60H 1/24 | (2006.01) |
| B60H 1/32 | (2006.01) |
| B60W 40/08 | (2012.01) |

(52) U.S. Cl.
CPC ......... *B60R 16/0231* (2013.01); *B60H 1/246* (2013.01); *B60H 1/32* (2013.01); *B60R 16/03* (2013.01); *B60W 40/08* (2013.01); *H05K 7/20909* (2013.01); *H05K 7/20145* (2013.01)

(58) Field of Classification Search
CPC .......... B62D 25/20; B60H 1/246; B60H 1/32; B60H 2001/003; B60K 1/04; B60K 2001/005; B60K 31/00; B60L 1/00; B60L 58/26; B60N 2/002; B60N 2/005; B60R 16/0231; B60R 16/03; B60R 16/0239; B60R 16/033; B60W 40/08; B60W 30/14; B60W 2040/0881; H05K 7/20145; H05K 7/20909; Y02T 10/70
USPC ............................................. 701/36
See application file for complete search history.

(56) References Cited

U.S. PATENT DOCUMENTS 6,709,328 B1 * 3/2004 Jain .................... B60H 1/00371
454/108
6,902,020 B2 * 6/2005 Kronner ................. B60R 16/04
180/68.5
(Continued)

FOREIGN PATENT DOCUMENTS

| CN | 102444985 A | 5/2012 |
| CN | 102914197 A | 2/2013 |

(Continued)

*Primary Examiner* — Thomas E Worden
*Assistant Examiner* — Sean Patrick Reidy
(74) *Attorney, Agent, or Firm* — Dinsmore & Shohl LLP

(57) ABSTRACT

An autonomous driving device module mounting structure includes: a floor panel that constitutes a part of a vehicle body and extends in a front to rear direction of a vehicle and a width direction of the vehicle; a rear seat that is disposed on a vehicle upper side of the floor panel such that a gap is formed with respect to the floor panel; and an autonomous driving device module that is equipped with a plurality of devices and is disposed on the vehicle upper side of the floor panel and a vehicle lower side of the rear seat.

17 Claims, 6 Drawing Sheets

(56) References Cited

U.S. PATENT DOCUMENTS

| | | | |
|---|---|---|---|
| 7,396,075 B2* | 7/2008 | Ohkuma | B60N 2/36 297/15 |
| 11,370,287 B2* | 6/2022 | Tsuyuzaki | B62D 21/157 |
| 2012/0085742 A1 | 4/2012 | Niederer et al. | |
| 2014/0374180 A1* | 12/2014 | Katayama | B60R 16/04 180/68.5 |
| 2015/0107921 A1* | 4/2015 | Naruke | B60K 1/04 180/68.5 |
| 2015/0375608 A1* | 12/2015 | Zhu | B60K 1/04 180/68.5 |
| 2016/0039263 A1* | 2/2016 | Mori | B60H 1/143 62/243 |
| 2017/0220039 A1* | 8/2017 | Funakawa | B60W 50/14 |
| 2017/0267058 A1* | 9/2017 | Koyama | B60N 2/015 |
| 2017/0334310 A1 | 11/2017 | Yokoyama et al. | |
| 2017/0368947 A1* | 12/2017 | Kume | B60L 53/12 |
| 2018/0056894 A1* | 3/2018 | Tsumura | B60K 1/04 |
| 2018/0178675 A1* | 6/2018 | Suzuki | H01M 50/20 |
| 2018/0229676 A1* | 8/2018 | Hudson | H02H 7/262 |
| 2018/0281624 A1 | 10/2018 | Nagasawa | |
| 2019/0171258 A1* | 6/2019 | Rice | H05K 7/20854 |
| 2020/0189665 A1* | 6/2020 | Friedman | B62D 29/041 |

FOREIGN PATENT DOCUMENTS

| | | |
|---|---|---|
| CN | 106133806 A | 11/2016 |
| CN | 207065831 U | 3/2018 |
| CN | 108688518 A | 10/2018 |
| DE | 102011011800 A1 | 8/2012 |
| EP | 2223836 A1 | 9/2010 |
| JP | H07-061357 A | 3/1995 |
| JP | H09-012289 A | 1/1997 |
| JP | H10-203215 A | 8/1998 |
| JP | 2008-155828 A | 7/2008 |
| JP | 2017-206135 A | 11/2017 |
| JP | 2017-226343 A | 12/2017 |
| JP | 2018-511515 A | 4/2018 |
| JP | 2018-167725 A | 11/2018 |
| KR | 10-2018-0026243 A | 3/2018 |
| WO | 2014/162892 A1 | 10/2014 |

\* cited by examiner

AUTONOMOUS DRIVING DEVICE MODULE MOUNTING STRUCTURE AND AUTONOMOUS DRIVING ELECTRIC VEHICLE

CROSS REFERENCE TO RELATED APPLICATIONS

This application claims priority to Japanese Patent Application No. 2018-212533 filed on Nov. 12, 2018, which is incorporated herein by reference in its entirety including the specification, drawings and abstract.

BACKGROUND

1. Technical Field

This disclosure relates to an autonomous driving device module mounting structure and an autonomous driving electric vehicle.

2. Description of Related Art

Published Japanese Translation of PCI application No. 2018-511515 (JP-A-2018-511515) below discloses a disclosure related to a driving support system for a vehicle. In this driving support system for the vehicle, the vehicle can be switched from a manual driving mode to an autonomous driving mode by an autonomous driving device.

SUMMARY

Incidentally, in order to install the autonomous driving device in the vehicle, a space for disposing devices constituting the autonomous driving device needs to be secured. Then, as a space that can be used to dispose the autonomous driving device, a space that can be freely used by a passenger, such as a luggage space can be exemplified. However, when the space that can be freely used by the passenger is decreased in size, the convenience of the vehicle is impaired.

This disclosure provides an autonomous driving device module mounting structure and an autonomous driving electric vehicle capable of mounting a device constituting an autonomous driving device thereon while securing a space freely used by a passenger.

An autonomous driving device module mounting structure according to a first aspect of the present disclosure includes: a floor panel that constitutes a part of a vehicle body and extends in a front to rear direction of a vehicle and a width direction of the vehicle; a rear seat that is disposed on a vehicle upper side of the floor panel such that a gap is formed with respect to the floor panel; and an autonomous driving device module that is equipped with a plurality of devices and is disposed on a vehicle upper side of the floor panel and a vehicle lower side of the rear seat.

According to the above aspect, since the autonomous driving device module obtained by integrating the plurality of devices is provided, the autonomous driving of the vehicle can be performed by the autonomous driving device module.

Incidentally, in order to install the autonomous driving device module in the vehicle, a space for disposing the autonomous driving device module needs to be secured. Then, as the space that can be used to dispose the autonomous driving device module, a space that can be freely used by a passenger, such as a luggage space can be exemplified. However, when the space that can be freely used by the passenger is decreased in size, the convenience of the vehicle is impaired.

In the above aspect, the rear seat on which the passenger can sit is disposed on the vehicle upper side of the floor panel constituting a part of the vehicle body and extending in the front to rear direction of the vehicle and the width direction of the vehicle so that a gap is formed with respect to the floor panel. For this reason, the space on the vehicle upper side of the floor panel and the vehicle lower side of the rear seat is secured.

Then, the autonomous driving device module is disposed in the space between the floor panel and the rear seat and the autonomous driving device module can be mounted on the vehicle without sacrificing the space that can be freely used by the passenger.

In the above aspect, the plurality of devices may include an autonomous driving control unit, an auxiliary power supply unit, a power converting unit, and an air blowing unit, the autonomous driving control unit may be configured to control a movement a vehicle in an autonomous driving mode, the auxiliary power supply unit may be provided separately from a main power supply unit provided in the vehicle and be configured to supply power to the autonomous driving control unit, the power converting unit may be configured to convert power supplied from the auxiliary power supply unit and to supply the power to the autonomous driving control unit, and the air blowing unit may be configured to blow cooling air toward at least one of the autonomous driving control unit, the auxiliary power supply unit, and the power converting unit.

According to the above aspect, the autonomous driving device module may include an autonomous driving control unit and the movement of the vehicle in the autonomous driving mode can be controlled by the autonomous driving control unit. Further, the autonomous driving device module may include an auxiliary power supply unit and a power converting unit. Accordingly, even in a state in which power cannot be supplied from the main power supply unit provided in the vehicle to the autonomous driving control unit, the power supplied from the auxiliary power supply unit is converted by the power converting unit so as to be supplied to the autonomous driving control unit and is supplied to the autonomous driving control unit.

Additionally, the autonomous driving device module may include an air blowing unit and cooling air may flow from the air blowing unit toward at least one of the autonomous driving control unit, the auxiliary power supply unit, and the power converting unit so that at least one of them can be cooled by the cooling air. Accordingly, as for one to which the cooling air blows among the autonomous driving control unit, the auxiliary power supply unit, and the power converting unit, an extreme increase in temperature during the operation is suppressed.

In the above aspect, the autonomous driving device module may include an outer casing portion, the outer casing portion may accommodate the autonomous driving control unit, the auxiliary power supply unit, the power converting unit, and a blowing port of the air blowing unit, the outer casing portion may be disposed with one direction as the long direction, the blowing port of the air blowing unit may be disposed on one side of the outer casing portion in the long direction inside the outer casing portion and may be opened to the other side of the outer casing portion in the long direction and a portion on the other side of the peripheral wall portion of the outer casing portion in the long direction may be provided with an exhaust port.

According to the above aspect, the autonomous driving device module may include an outer casing portion disposed with one direction as the long direction and the outer casing portion may accommodate the autonomous driving control unit, the auxiliary power supply unit, the power converting unit, and at least the blowing port of the air blowing unit.

Then, the blowing port may be disposed on one side of the outer casing portion in the long direction inside the outer casing portion and the blowing port may blow air toward the other side of the outer casing portion in the long direction. Meanwhile, an exhaust port may be provided in a portion on the other side of the outer casing portion in the long direction in the peripheral wall portion of the outer casing portion. For this reason, the cooling air blown out from the air blowing unit can pass straight through the outer casing portion and hence the staying of the cooling air inside the outer casing portion can be suppressed.

In the above aspect, the autonomous driving control unit may include a map information storage unit, an own position estimation unit, and a driver state estimation unit, the map information storage unit may be configured to store map information, the own position estimation unit may be configured to estimate a position of an own vehicle based on the map information and a signal transmitted from a peripheral situation acquisition unit capable of acquiring a peripheral situation of the own vehicle, and the driver state estimation unit may be configured to estimate a driver state based on a signal transmitted from a monitoring unit configured to monitor a state of a driver sitting on a driver seat.

According to the above aspect, the autonomous driving control unit may further include a map information storage unit and an own position estimation unit and the own position estimation unit can estimate the position of the own vehicle based on the map information stored in the map information storage unit and the signal transmitted from the peripheral situation acquisition unit capable of acquiring the peripheral situation of the own vehicle.

Further, the autonomous driving control unit may further include a driver state estimation unit and the driver state estimation unit can estimate the driver state based on the signal transmitted from the monitoring unit capable of monitoring, the state of the driver sitting on the driver seat.

In the above aspect, the outer casing portion may be disposed with the width direction of the vehicle as a long direction, an exhaust port side connector portion that is provided in one disposed adjacently to the exhaust port among the map information storage unit, the own position estimation unit, and the driver state estimation unit may be disposed so that a wiring or device is connectable from an exhaust port side, and an opening side connector portion that is provided in one disposed adjacently to an opening portion provided in a portion on one side of the peripheral wall portion in the front to rear direction of the vehicle among the map information storage unit, the own position estimation unit, and the driver state estimation unit may be disposed so that a wiring or device is connectable from an opening portion side.

According to the above aspect, the outer casing portion may be disposed in a space on the vehicle upper side of the floor panel and the vehicle lower side of the rear seat with the width, direction of the vehicle as the long direction.

Incidentally, since the rear seat of the vehicle tends to have a configuration in which a plurality of seat cushions is disposed adjacently in the seat width direction, there is a tendency that the space on the vehicle upper side of the floor panel and the vehicle lower side of the rear seat increases in size in the width direction of the vehicle.

In the above aspect, the outer casing portion may be disposed as described above and a space is easily secured on one side of the outer casing portion in the width direction of the vehicle and the other side in the width direction of the vehicle as compared with a configuration in which the outer casing portion is disposed with the front to rear direction of the vehicle as the long direction. For this reason, it is possible to smoothly suck air by the air blowing unit and discharge air from the exhaust port.

Incidentally, in a case in which power is supplied to the map information storage unit, the own position estimation unit, and the driver state estimation unit or a signal is transmitted and received between these components and other devices, the outer casing portion may be provided so that various wirings or devices connected thereto are connectable.

Meanwhile, when an opening portion for connecting a wiring or device is provided at both sides in the front to rear direction of the vehicle of the peripheral wall portion of the outer casing portion, it is troublesome to connect a wiring or device to the map information storage unit, the own position estimation unit, and the driver state estimation unit.

In the above aspect, the exhaust port side connector portion provided in one disposed adjacently to the exhaust port among the map information storage unit, the own position estimation unit, and the driver state estimation unit may be disposed so that a wiring or device is connectable from the exhaust port side. Further, an opening portion may be provided in portion on one side of the peripheral wall portion of the outer casing portion in the front to rear direction of the vehicle and an opening side connector portion provided in a portion disposed adjacently to the opening portion among the map information storage unit, the own position estimation unit, and the driver state estimation unit may be disposed so that a wiring or device is connectable from the opening portion side.

For this reason, it is possible to simplify a connection portion of the wiring or device with respect to the map information storage unit, the own position estimation unit, and the driver state estimation unit as compared with a configuration in which the opening portion is provided at both sides in the front to rear direction of the vehicle of the peripheral wall portion of the outer casing portion.

In the above aspect, each of the map information storage unit, the own position estimation unit, the driver state estimation unit, and the power converting unit may include an inner casing portion constituting an outer shell and a flow passage of cooling air may be formed from the blowing port to the exhaust port by the peripheral wall portion and the inner casing portion.

According to the above aspect, each of the map information storage unit, the own position estimation unit, the driver state estimation unit, and the power converting unit may include the inner casing portion constituting the outer shell. Then, the flow passage of the cooling air blown out from the air blowing unit may be formed from the blowing port of the air blowing unit to the exhaust port by the inner casing portion and the peripheral wall portion of the outer casing portion. For this reason, the cooling air can be applied to each of the map information storage unit, the own position estimation unit, the driver state estimation unit and the power converting unit without disposing a duct inside the outer casing portion and the cooling air can be smoothly blown through the outer casing portion.

In the above aspect, the inner casing portion may be provided with a heat dissipation portion that protrudes toward the flow passage and extends along the flow passage.

According to the above aspect, the inner casing portion may be provided with the heat dissipation portion that protrudes toward the flow passage of the cooling air blown out from the air blowing unit and the surface area of the inner casing, portion on the flow passage side in the inner casing portion can be increased. For this reason, the heat dissipation amount from the inner casing portion to the cooling air blown out from the air blowing unit can be increased. Further, since the heat dissipation portion may extend along the flow passage of the cooling air blown out from the air blowing unit, it is possible to prevent the heat dissipation portion from serving as a resistance against the cooling air.

An autonomous driving electric vehicle according to a second aspect of this disclosure includes: a floor panel that constitutes a part of a vehicle body and extends in a front to rear direction of a vehicle and a width direction of the vehicle; a rear seat that is disposed on a vehicle upper side of the floor panel so that a gap is formed with respect to the floor panel and on which passenger is able to sit; an autonomous driving device module that is equipped with a plurality of devices and is disposed on the vehicle upper side of the floor panel and the vehicle lower side of the rear seat; and a main power supply unit that is configured to supply power to a power unit and the autonomous driving device module, is provided separately from the autonomous driving device module, and is disposed on a vehicle lower side of the floor panel.

According to the above-described aspect, the rear seat on which the passenger can sit may be disposed on the vehicle upper side of the floor panel constituting a part of the vehicle body and extending in the front to rear direction of the vehicle and the width direction of the vehicle so that a gap is formed with respect to the floor panel. Then, the autonomous driving device module is disposed in the space between the floor panel and the rear seat and the autonomous driving device module can be mounted on the vehicle without sacrificing the luggage space.

Further, in the above-described aspect, a main power supply unit provided separately from the autonomous driving device module may be provided and power is supplied from the main power supply unit to the power unit and the autonomous driving device module so that these are driven and the autonomous driving of the vehicle can be performed. Additionally, the main power supply unit may be disposed on the vehicle lower side of the floor panel and the main power supply unit can be mounted on the vehicle without sacrificing the luggage space.

In the above aspect, the plurality of devices may include an autonomous driving control unit, an auxiliary power supply unit, a power converting unit, and an air blowing unit, the autonomous driving control unit may be configured to control a movement of the vehicle in an autonomous driving mode, the auxiliary power supply unit may be provided separately from the main power supply unit provided in the vehicle and be configured to supply power to the autonomous driving control unit, the power converting unit may be configured to convert power supplied from the auxiliary power supply unit and to supply the power to the autonomous driving control unit, and the air blowing unit may be configured to blow cooling air toward at least one of the autonomous driving control unit, the auxiliary power supply unit, and the power converting unit.

In the above aspect, the autonomous driving device module may include an outer casing portion, the outer casing portion may accommodate the autonomous driving control unit, the auxiliary power supply unit, the power converting unit, and a blowing port of the air blowing unit, the outer casing portion may be disposed with one direction as a long direction, the blowing port of the air blowing unit may be disposed on one side of the outer casing portion in the long direction inside the outer casing portion and be opened to the other side of the outer casing portion in the long direction, and a portion on the other side of a peripheral wall portion of the outer casing portion in the long direction may be provided with an exhaust port.

In the above aspect, the autonomous driving control unit may include a map information storage unit, an own position estimation unit, and a driver state estimation unit, the map information storage unit may be configured to store map information, the own position estimation unit may be configured to estimate a position of an own vehicle based on the map information and a signal transmitted from a peripheral situation acquisition unit capable of acquiring a peripheral situation of the own vehicle, and the driver state estimation unit may be configured to estimate a driver state based on a signal transmitted from a monitoring unit configured to monitor a state of a driver sitting on a driver seat.

In the above aspect, the outer casing portion may be disposed with the width direction of the vehicle as a long direction, an exhaust port side connector portion that is provided in one disposed adjacently to the exhaust port among the map information storage unit, the own position estimation unit, and the driver state estimation unit may be disposed so that a wiring or device is connectable from an exhaust port side, and an opening side connector portion that is provided in one disposed adjacently to an opening portion provided in a portion on one side of the peripheral wall portion in the front to rear direction of the vehicle among the map information storage unit, the own position estimation unit, and the driver state estimation unit may be disposed so that a wiring, or device is connectable from an opening portion side.

In the above aspect, each of the map information storage unit, the own position estimation unit, the driver state estimation unit, and the power converting unit may include an inner casing portion constituting an outer shell, and a flow passage of cooling air blown out from the air blowing unit may be formed from the blowing port to the exhaust port by the peripheral wall portion and the inner casing portion.

In the above aspect, the inner casing portion may be provided with a heat dissipation portion that protrudes toward the flow passage and extends along the flow passage.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
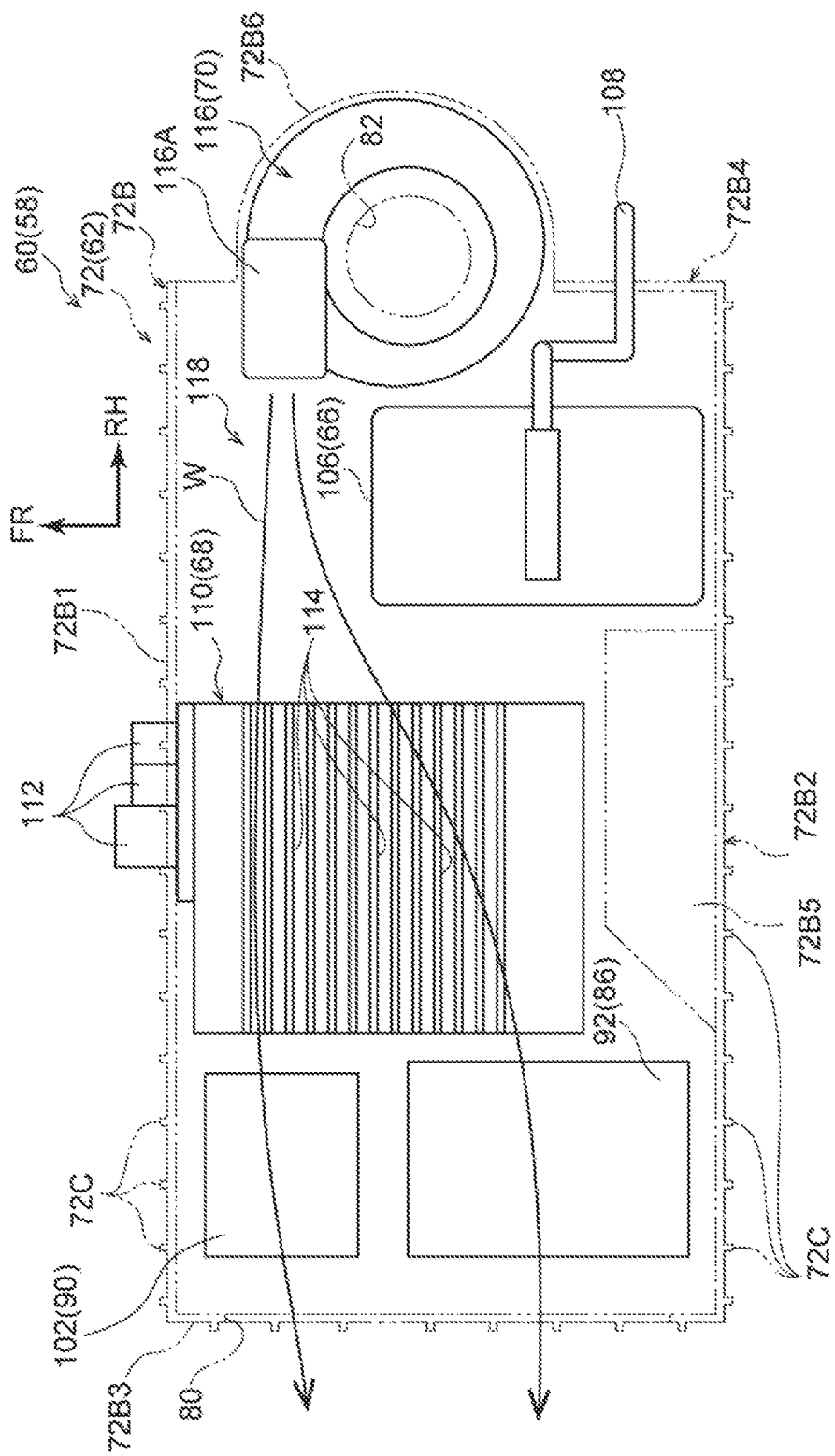
FIG. 1 is a plan view illustrating a configuration of an autonomous driving device module mounted on a vehicle that adopts an autonomous driving device module mounting structure according to an embodiment (a diagram when viewed from a direction I of FIG. 4)

Hereinafter, an example of an embodiment of an autonomous driving device module mounting structure will be described with reference to FIGS. 1 to 6. Furthermore, in the drawings, an arrow FR indicates a vehicle front side, an arrow UP indicates a vehicle upper side, and an arrow RH indicates a right side of the width direction of the vehicle.

Above all, an overall configuration of a "vehicle 10" which corresponds to an autonomous driving electric vehicle and an own vehicle adopting an autonomous driving device module mounting structure according to the embodiment will be described with reference to FIGS. 5 and 6.

Figure 6:
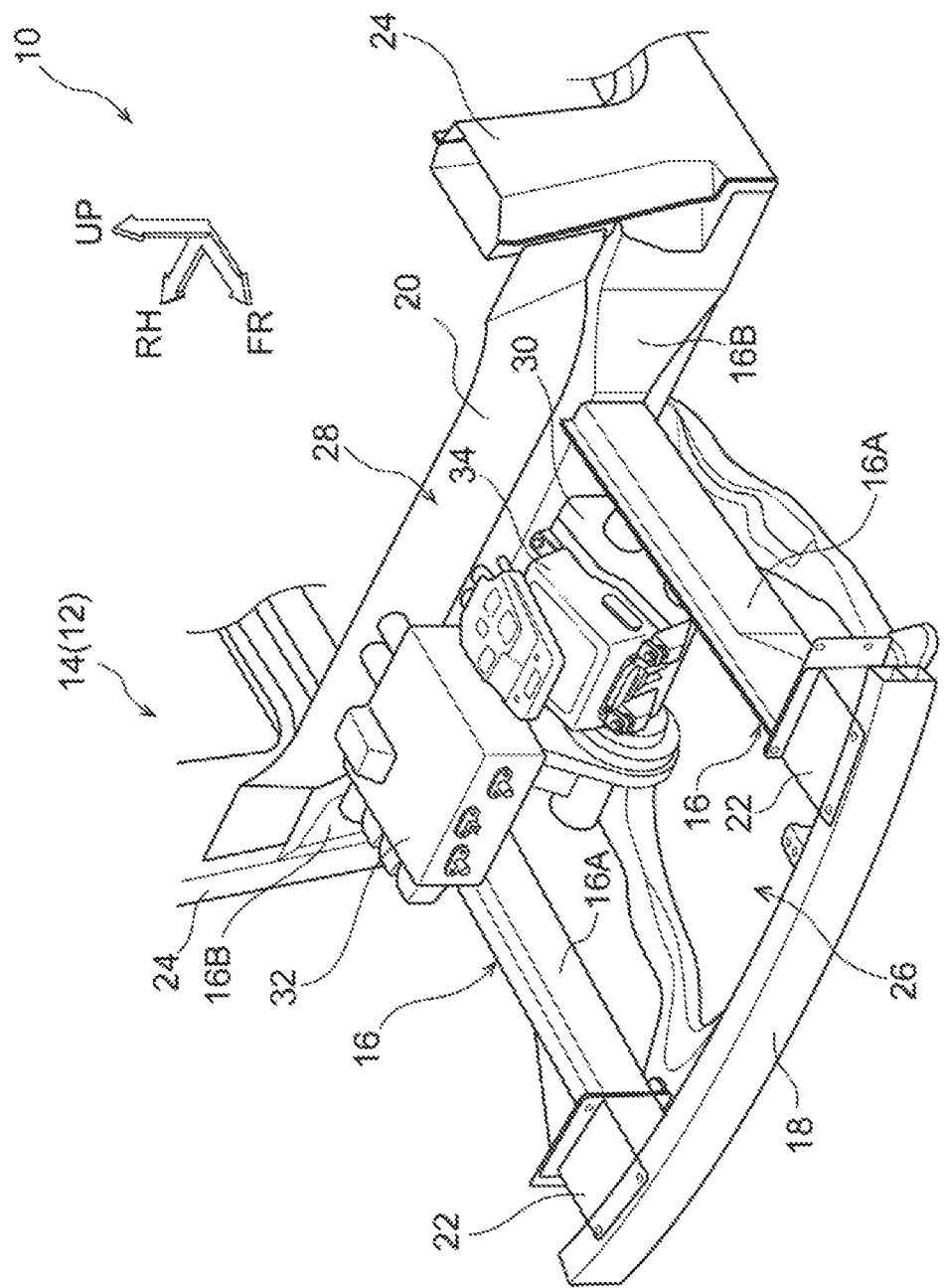
FIG. 6 is a perspective view illustrating configurations of a power unit and a vehicle body front part of the vehicle that adopts the autonomous driving device module mounting structure according to the embodiment when viewed from the vehicle front outside.

As illustrated in FIG. 6, a vehicle body front part 14 which constitutes a part on a vehicle front side of a vehicle body 12 of a vehicle 10 includes a pair of front side members 16, a bumper reinforcement 18 (hereinafter, referred to as a bumper R/F 18), and a dash panel 20.

The front side member 16 includes a front portion 16A which extends in the front to rear direction of the vehicle and a kick portion 16B which extends obliquely downward from a vehicle rear side poo ion of the front portion 16A toward the vehicle rear side.

Meanwhile, the bumper R/F 18 is disposed on the vehicle front side of the front side member 16 with the long direction as the width direction of the vehicle and is formed by an extruded material of aluminum alloy as an example. Both end portions of this bumper R/F 18 are connected to the end portion of the front side member 16 on the vehicle trout side through a crash box 22 and the bumper R/F 18 is bridged between the pair of front side member 16 in the width direction of the vehicle.

Meanwhile, a front pillar 24 which extends in the up and down direction of the vehicle is disposed on the vehicle rear side of each of the front side member 16. Then, a dash panel 20 is disposed on the vehicle rear side of the front side member 16 to be located between the front side members 16.

The dash panel 20 extends in the width direction of the vehicle and the up and down direction of the vehicle and is disposed with the plate thickness direction as the front to rear direction of the vehicle. Then, in the vehicle body front part 14, a space which is defined by the bumper R/F 18, the front side member 16, and the dash panel 20 when viewed from the up and down direction of the vehicle is formed as a power unit room 26 and "a power unit 28" is disposed inside the power unit room 26.

The power unit 28 includes a motor 30, a power distribution unit 32, and a DC/AC inverter 34 (hereinafter, referred to as an inverter 34).

The motor 30 is driven by power supplied thereto and the driving force of the motor 30 is transmitted to a drive wheel (not illustrated) through a counter gear mechanism (not illustrated), a differential gear mechanism, and the like.

Meanwhile, the power distribution unit 32 is disposed on the vehicle upper side of the motor 30 and is fixed to the vehicle body front part 14 through a support member (not illustrated). This power distribution unit 32 includes a housing having a substantially rectangular parallelepiped outer shape and a plurality of devices (not illustrated) incorporated inside the housing, that is, high voltage junction box, a DC charging relay, an AC charger, and a DC/DC converter. This power distribution unit 32 is electrically connected to a charging port (not illustrated) via a wire harness (not illustrated).

Further, the power distribution unit 32 is configured to supply (distribute) power supplied through a charging port from an external power supply such as a charging stand (not illustrated) to a "main battery 36 (see FIG. 5)" which is a main power supply unit to be described later. Then, the power stored in the main battery 36 can be supplied (distributed) to devices like the inverter 34 and the like by the power distribution unit 32.

Meanwhile, the inverter 34 includes a box-shaped housing and a plurality of electronic devices (not illustrated) provided in the housing and is attached to the motor 30 from the vehicle upper side. This inverter 34 can convert power supplied thereto so that the power can be supplied to the motor 30 and can convert a DC current supplied from the main battery 36 or the like into an AC current so that the AC current can flow to the motor 30.

Next, a configuration of a floor portion 38 of the vehicle body 12 constituting a vehicle lower side portion of the vehicle body 12 and its peripheral portion will be described with reference to FIG. 5. The floor portion 38 includes a "floor panel 40", a pair of rockers 42, and a floor upper panel 44. The floor panel 40 is formed by pressing a steel plate and extends in the front to rear direction of the vehicle and the width direction of the vehicle when viewed from the up and down direction of the vehicle. A portion on the vehicle rear side of the floor panel 40 is provided with a bulging portion 40A which bulges toward the vehicle upper side in a protruding manner and a part of the main battery 36 is accommodated inside the bulging portion 40A as will be described later.

The rocker 42 extends along the outer peripheral edge portion of the floor panel 40 in the width direction of the vehicle and has a closed cross-sectional structure in which a cross-sectional shape when viewed from the front to rear direction of the vehicle becomes a closed cross-section. Further, a pair of floor cross members 46 which extends in the width direction of the vehicle along a surface on the vehicle upper side of the floor panel 40 and is disposed at a predetermined interval in the front to rear direction of the vehicle is bridged between the pair of rockers 42 on the vehicle front side of the bulging portion 40A. Furthermore, the floor cross member 46 is joined to the floor panel 40 and the rocker 42 by a joint portion (not illustrated). Then, the main battery 36 is disposed on the vehicle lower side of the floor panel 40.

The main battery 36 includes a battery casing 48 which constitutes an outer shell thereof and a battery module (not illustrated) which is disposed inside the battery casing 48. Specifically, the battery casing 48 has a constant dimension (height) in the up and down direction of the vehicle at a portion on the vehicle front side, that is, a portion overlapping a portion on the vehicle front side in relation to the bulging portion 40A of the floor panel 40 when viewed from the up and down direction of the vehicle. Meanwhile, a portion on the vehicle rear side of the battery casing 48, that is, a portion overlapping the bulging portion 40A when viewed from the up and down direction of the vehicle is provided with a bulging portion 48A which bulges toward the vehicle upper side in a protruding manner and has a shape smaller than that of the bulging portion 40A.

Then, a plurality of the battery modules is disposed so as to be connected to one another in the front to rear direction of the vehicle, are disposed as one stage in a portion on the vehicle front side of the battery casing 48, and are disposed as a plurality of stages in the up and down direction of the vehicle in a portion on the vehicle rear side of the battery casing 48 (a portion provided with the bulging portion 48A).

In the main battery 36 with the above-described configuration, a portion on the vehicle front side is received between the rockers 42 and a portion on the vehicle rear side is received inside the bulging portion 40A of the floor panel 40.

Meanwhile, the floor upper panel 44 is disposed on the vehicle upper side of the floor panel 40 and is formed in a plate shape which is bent in a substantially U-shape so as to be opened on the vehicle lower side when viewed from the width direction of the vehicle. This floor upper panel 44 includes an upper wall portion 44A which constitutes a portion on the vehicle upper side, a front wall portion 44B which constitutes a portion on the vehicle front side, and a rear wall portion 44C which constitutes a portion on the vehicle rear side. Furthermore, the floor upper panel 44 is joined to the floor panel 40 by a joint portion (not illustrated) in peripheral edge portions on the vehicle front side and the vehicle rear side.

Then, the upper wall portion 44A extends in the width direction of the vehicle and the front to rear direction of the vehicle and a "rear seat 50" on which a passenger can sit is disposed on the vehicle upper side of the upper wall portion 44A. That is, the rear seats 50 are disposed on the vehicle upper side of the floor panel 40 with a gap provided with respect to the floor panel 40.

This rear seat 50 includes a seat cushion 52, a seat back 54, and a headrest (not illustrated) and a plurality of the rear seats is disposed so as to be connected to each other iii the width direction of the vehicle. Furthermore, the seat cushion 52 is supported by an upper wall portion 44A through a seat slide rail (not illustrated). Meanwhile, a chamber 56 is formed on the vehicle lower side of the rear seat 50 by the floor upper panel 44 and the floor panel 40.

Here, in this embodiment, it has a feature that an "autonomous driving device module 60" obtained by integrating a plurality of devices constituting a part of the autonomous driving device 58 is disposed inside the chamber 56. Hereinafter, a configuration of the autonomous driving device module 60 that constitutes a main part of the embodiment will be described in detail.

Figure 4:
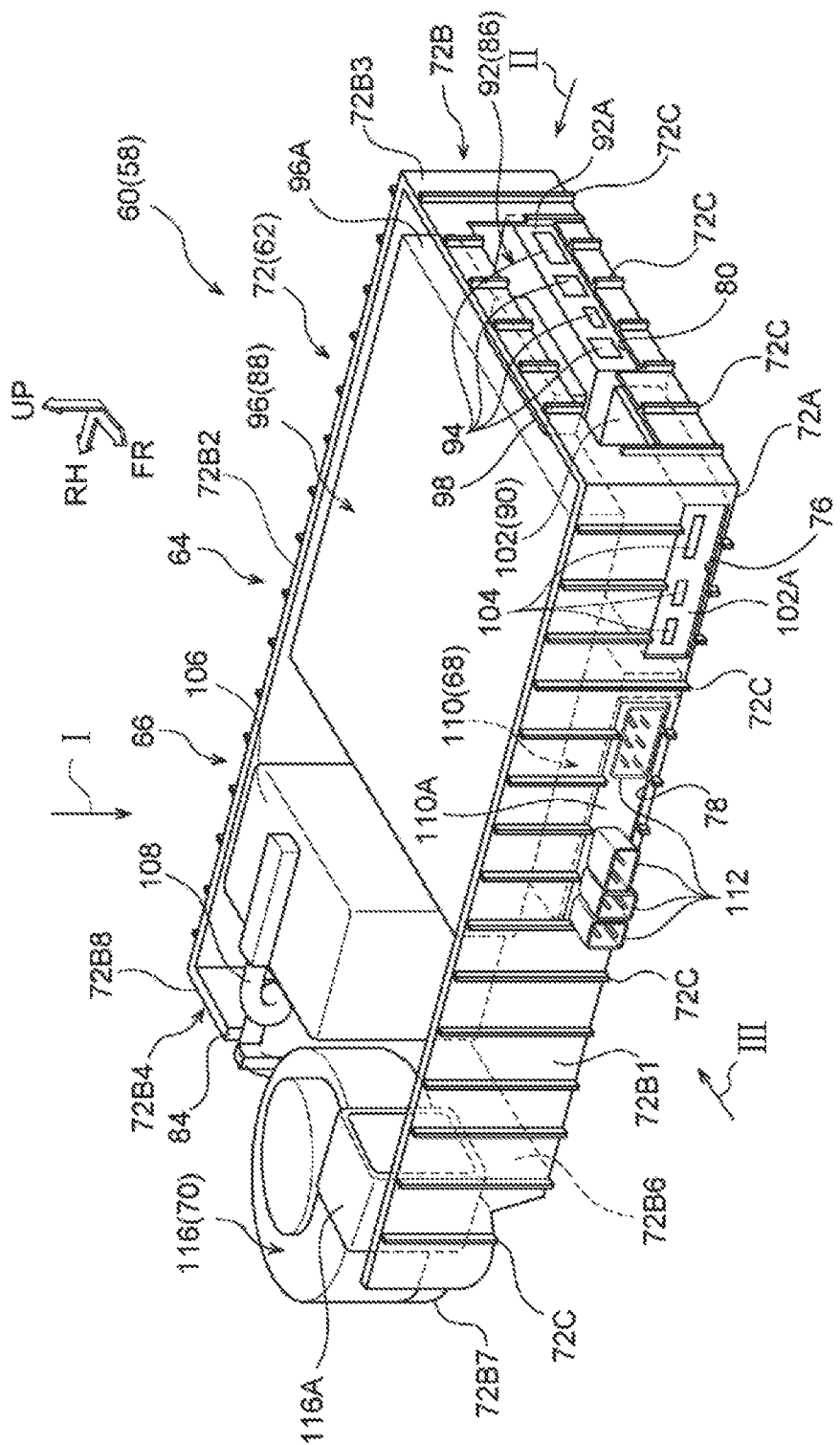
FIG. 4 is a perspective view illustrating the configuration of the autonomous driving device module mounted on the vehicle that adopts the autonomous driving device module mounting structure according to the embodiment when viewed from the vehicle front outside.

As illustrated in FIG. 4, the autonomous driving device module 60 includes a "casing 62" which is an outer casing portion constituting an outer shell thereof, an "autonomous driving control unit 64", a "sub-battery 66" which is an auxiliary power supply unit, a "DC/DC converter 68" (hereinafter, referred to as a converter 68) which is a power converting unit, and a "single blower 70" which is an air blowing unit.

Figure 2:
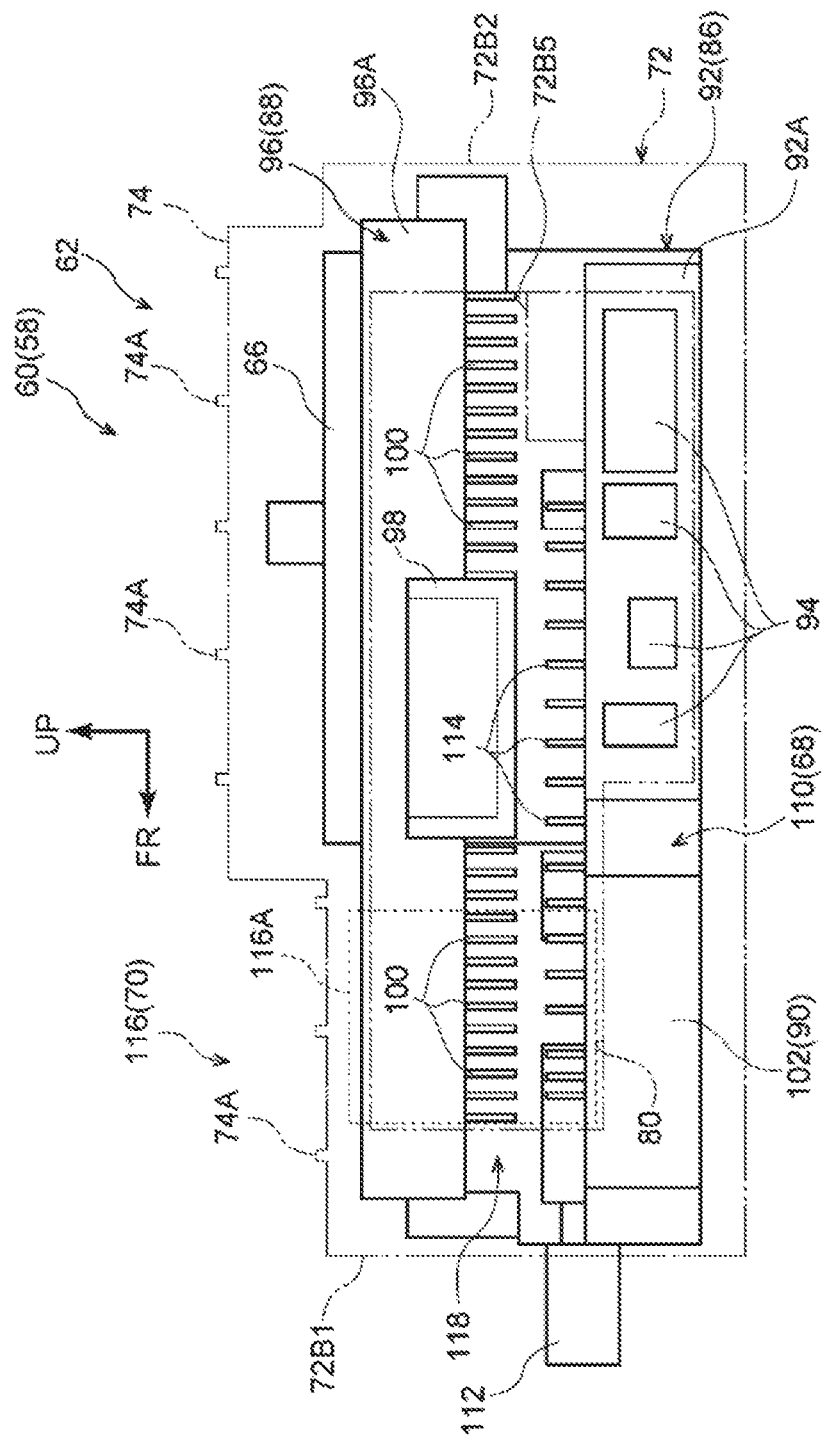
FIG. 2 is a side view illustrating the configuration of the autonomous driving device module mounted on the vehicle that adopts the autonomous driving device module mounting structure according to the embodiment (a diagram when viewed from a direction II of FIG. 4)

The casing 62 includes, as also illustrated in FIG. 2, a main body portion 72 which constitutes a main portion thereof and a lid 74 which constitutes a portion on the vehicle upper side, is formed in a substantially rectangular parallelepiped outer shape on the whole, and is disposed with the long direction as the width direction of the vehicle. Furthermore, FIGS. 1 to FIGS. 3 and 5, the casing 62 is indicated by an imaginary line in order to easily understand the configuration of the autonomous driving device module 60. Further, for the same purpose, the lid 74 is not illustrated in FIG. 4.

The main body portion 72 includes a lower wall portion 72A which constitutes a portion on the vehicle lower side and a "peripheral wall portion 72B" which extends from the peripheral edge portion of the lower wall portion 72A toward the vehicle upper side and constitutes the outer peripheral portion of the main body portion 72 and is formed in a box shape so as to be opened on the vehicle upper side.

Specifically, the lower wall portion 72A is formed in a plate shape with the plate thickness direction as the up and down direction of the vehicle and is attached to the floor cross member 46 by an attachment member (not illustrated) while being placed on the vehicle upper side of the pair of floor cross members 46.

Meanwhile, the peripheral wall portion 72B includes a front wall portion 72B1 which constitutes a part on the vehicle front side, a rear wall portion 72B2 which constitutes a part on the vehicle rear side, a side wall portion 72B3 which constitutes a part on the left side in the width direction of the vehicle, and a side wall portion 72B4 which constitutes a part on, the right side in the width direction of the vehicle.

The front wall portion 72B1 is formed in a plate shape with the plate thickness direction as the front to rear direction of the vehicle and an end portion on the left side in the width direction of the vehicle in the portion on the vehicle lower side is provided with an "opening portion 76" which is formed by penetrating the front wall portion 72B1 in the front to rear direction of the vehicle and is formed in a rectangular shape when viewed from the front to rear direction of the vehicle. Further, a center portion in the width direction of the vehicle in a portion on the vehicle lower side of the front wall portion 72B1 is provided with an "opening portion 78" which is formed by penetrating the front wall portion 72B1 in the front to rear direction of the vehicle and is formed in a rectangular shape when viewed from the front to rear direction of the vehicle.

The rear wall portion 72B2 is basically formed in a plate shape with the plate thickness direction as the front to rear direction of the vehicle, but a center portion in the width direction of the vehicle is provided with a bulging portion 72B5 which bulges toward the vehicle front side (see FIG. 1). Furthermore, the bulging portion 72B5 is formed in a substantially trapezoidal shape in which a portion on the left side in the width direction of the vehicle when viewed from the up and down direction of the vehicle is narrowed as it goes toward the left side in the width direction of the vehicle.

The side wall portion 72B3 is basically formed in a plate shape with the plate thickness direction as the width direction of the vehicle and the side wall portion 72B3 is provided with an "exhaust port 80" discharging air in the blower 70 and formed by penetrating the side wall portion 72B3 in the width direction of the vehicle.

This exhaust port 80 has a concave hexagonal shape when viewed from the width direction of the vehicle, more specifically, a polygonal shape in which a corner portion on the vehicle front lower side disposed with the long direction as the front to rear direction of the vehicle and formed in a rectangular shape when viewed from the width direction of the vehicle is cut in a rectangular shape.

The side wall portion 72B4 includes an inclined wall portion 72B6, an extension wall portion 72B7, and a vertical wall portion 72B8. The inclined wall portion 72B6 extends obliquely upward from the peripheral edge portion on the right side of the lower wall portion 72A in the width direction of the vehicle toward the right side in the width direction of the vehicle.

The extension wall portion 72B7 extends, as also illustrated in FIG. 1, from a portion on the vehicle front side in the peripheral edge portion on the vehicle upper side of the inclined wall portion 72B6 toward the right side in the width direction of the vehicle and is formed in a semi-circular plate shape which protrudes toward the right side in the width direction of the vehicle when viewed from the up and down direction of the vehicle. Further, the blower 70 is disposed on the vehicle upper side of the extension wall portion 72B7 and the center portion of the extension wall portion 72B7 is provided with a through hole 82 which is formed by penetrating the extension wall portion 72B7 in the up and down direction of the vehicle and is formed in a circular shape when viewed from the up and down direction of the vehicle.

Meanwhile, the vertical wall portion 72B8 extends from a portion on the vehicle rear side in the peripheral edge portion on the vehicle upper side of the inclined wall portion 72B6 toward the vehicle upper side and is formed in a plate shape with the plate thickness direction as the width direction of the vehicle. Further, a part of the end portion on the vehicle upper side of the vertical wall portion 72B8 is cut so as to protrude toward the vehicle lower side and this portion is formed as a locked portion 84 to which a wire harness 108 to be described later can be locked. Furthermore, the peripheral wall portion 72B is provided with a plurality of protrusion portions 72C and the protrusion portions 72C protrude from the surface of the peripheral wall portion 72B toward the outside of the casing 62, extend in the up and down direction of the vehicle, and are disposed in the extension direction of the peripheral wall portion 72B with a gap formed therebetween.

Figure 3:
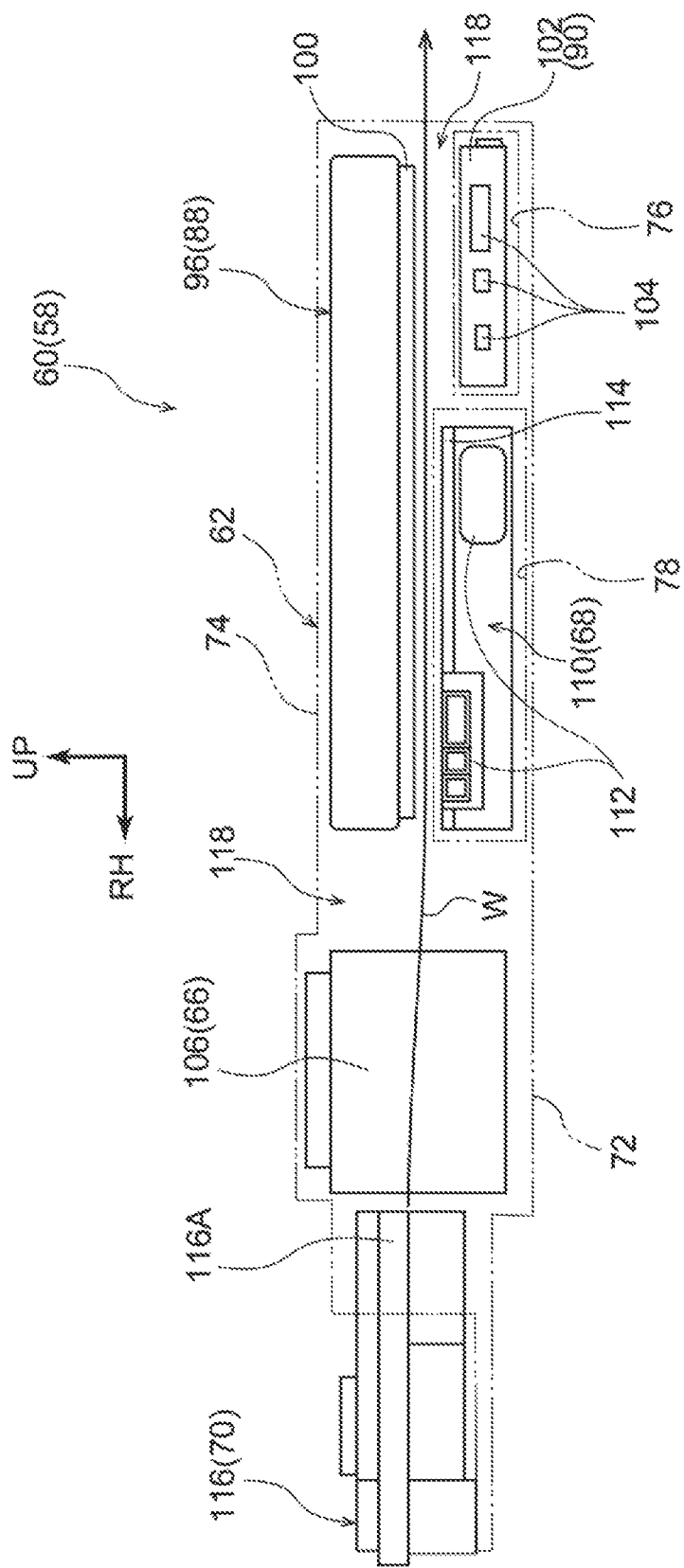
FIG. 3 is a front view illustrating the configuration of the autonomous driving device module mounted on the vehicle that adopts the autonomous driving device module mounting structure according to the embodiment (a diagram when viewed from a direction III of FIG. 4)

Meanwhile, the lid 74 covers, as illustrated in FIGS. 2 and 3, the main body portion 72 from the vehicle upper side, is formed in a substantially rectangular shape when viewed from the up and down direction of the vehicle, and is attached to the main body portion 72 by an attachment member (not illustrated). Furthermore, the lid 74 is also provided with a plurality of protrusion portions 74A similarly to the main body portion 72 and the protrusion portions 74A protrude from the surface of the lid 74 toward the outside of the casing 62, extend in the width direction of the vehicle, and are disposed at intervals in the short direction of the casing 62.

Next, a configuration of the autonomous driving control unit 64 will be described. The autonomous driving control unit 64 includes, as illustrated in FIG. 4, an "altitude map information Electronic Control Unit (ECU) 86" which is a map information storage unit, an "autonomous driving control ECU 88" which is an own position estimation unit, and a "driver monitor 90" which is a driver state estimation unit.

The altitude map information ECU 86 includes a "casing 92" which is an inner casing portion constituting an outer shell thereof and an electronic device (not illustrated) which is accommodated inside the casing 92. As also illustrated in FIGS. 1 and 2, this altitude map information ECU 86 is provided on the vehicle lower side inside the casing 62 so as to be disposed adjacently to the exhaust port 80 at the position of the vehicle rear side and the left side in the width direction of the vehicle.

Specifically, the casing 92 has a substantially rectangular parallelepiped outer shape and a side wall portion 92A near the exhaust port 80 is provided with a "plurality of connector portions 94" which is an exhaust port side connector portion. Then, the connector portion 94 is received inside the exhaust port 80 when viewed from the left side in the width direction of the vehicle and, is exposed when viewed from the outside of the casing 62.

Further, the altitude map information ECU 86 includes a storage unit (not illustrated) and the storage unit stores map information, specifically, road position information, road shape information (for example, the number of lanes, the type of lane, and the like), signal position information, position information of telephone poles arranged in the vicinity of the road, and the like. Furthermore, the position information mentioned herein includes not only two-dimensional (planar) position information but also three-dimensional (stereoscopic) position information.

The autonomous driving control ECU 88 includes a "casing 96" which is an inner casing portion constituting an outer shell thereof and an electronic device (not illustrated) which is accommodated inside the casing 96. This autonomous driving control ECU 88 is attached to the lid 74 of the casing 62 and is provided on the vehicle upper side inside the casing 62 so as to be adjacent to the exhaust port 80 at the position of the left side in the width direction of the vehicle.

Specifically, the casing 96 has a substantially rectangular parallelepiped outer shape occupying about a half of an area inside the casing 62 when viewed from the up and down direction of the vehicle and the side wall portion 96A near the exhaust port 80 is provided with a "plurality of connector portions 98" which is an exhaust port side connector portion. Then, the connector portions 98 are received inside the exhaust port 80 when viewed from the left side in the width direction of the vehicle and are exposed when viewed from the outside of the casing 62.

Additionally, the surface on the vehicle lower side of the casing 96 is provided with a "plurality of fin portions 100" which is a heat dissipation portion and the fin portions 100 are formed in a plate shape protruding from the surface toward the vehicle lower side and extending in the width direction of the vehicle. Furthermore, the tin portions 100 are disposed at intervals in the front to rear direction of the vehicle.

Further, the autonomous driving control ECU 88 is electrically connected to a locator camera and Laser Imaging Detection and Ranging (LIDAR) (not illustrated) which is a peripheral situation acquisition unit provided in the vehicle 10 and is able to detect the peripheral situation of the vehicle 10 based on signals transmitted therefrom.

Additionally, the autonomous driving control ECU 88 is electrically connected to the altitude map information ECU 86 and is able to estimate the position of the vehicle 10 by the combination of the map information stored in the altitude map information ECU 86 and the peripheral situation of the vehicle 10. Furthermore, a Global Positioning System (GPS) device (not illustrated) is also additionally used to estimate the position of the vehicle 10.

Additionally, the autonomous driving control ECU 88 is able to switch the driving state of the vehicle 10 between a manual driving mode and an autonomous driving mode and performs various controls on the vehicle 10 in the autonomous driving mode. Specifically, various actuators (not illustrated) disposed at respective positions of the vehicle 10 and constituting a part of the autonomous driving device 58 like various sensors (not illustrated) constituting a part of the autonomous driving device 58 are electrically connected to the autonomous driving control ECU 88. The autonomous driving control ECU 88 can control the movement of the vehicle 10 by controlling an accelerating amount, a braking amount, a steering angle, or the like while operating these actuators based on the state of the vehicle 10 (a change in acceleration or the like) detected from these sensors.

The driver monitor 90 includes a "casing 102" which is an inner casing portion constituting an outer shell thereof and an electronic device (not illustrated) which is accommodated inside the casing 102. This driver monitor 90 is provided on the vehicle lower side inside the casing 62 so as to be disposed adjacently to the opening portion 76 at the vehicle front side of the altitude map information ECU 86.

Specifically, the casing 102 has a substantially rectangular parallelepiped outer shape and a side wall portion 102A near the opening portion 76 is provided with a "plurality of connector portions 104" which is an opening side connector portion. Then, the connector portion 104 is received inside the opening portion 76 when viewed from the vehicle front side and is exposed when viewed from the outside of the casing 62. Furthermore, the driver monitor 90 is covered by the side wall portion 72B3 when viewed from the left side in the width direction of the vehicle.

Further, the driver monitor 90 is electrically connected to a CCD camera (not illustrated) which is a monitoring unit capable of monitoring a state of a driver sitting on a driver seat (not illustrated). Then, the driver monitor 90 can estimate the driver state (for example, an awakening degree) by detecting a driver's eye opening degree and the like from driver's image data obtained based on the signal transmitted from the CCD camera.

Next, a configuration of the sub-battery 66 will be described. The sub-battery 66 is a lithium ion secondary battery and includes a casing 106 which constitutes an outer shell and has a rectangular parallelepiped outer shape and a wire harness 108. This sub-battery 66 is provided on the right side of the altitude map information ECU 86 in the width direction of the vehicle so as to be disposed adjacently to the rear wall portion 72B2.

Further, the sub-battery 66 is electrically connected to the power distribution unit 32 through the wire harness 108 and is chargeable when power distributed from the power distribution unit 32 is supplied thereto. Further, power is generally supplied from the main battery 36 to the electronic device included in the autonomous driving device module 60, but in a state in which power cannot be supplied from the main battery 36, power is supplied from the sub-battery 66.

Next, a configuration of the converter 68 will be described. The converter 68 includes a "casing 110" which is an inner casing portion constituting an outer shell thereof and an electronic device (not illustrated) which is accommodated inside the casing 110. This converter 68 is provided on the vehicle lower side inside the casing 62 so as to be disposed adjacently to the opening portion 78 on the right side in the width direction of the vehicle of the altitude map information ECU 86 and the driver monitor 90 and the vehicle front side of the bulging portion 72B5.

Specifically, the casing 110 has a substantially rectangular parallelepiped outer shape and a side wall portion 110A near the opening portion 78 is provided with a "plurality of connector portions 112" which is an opening side connector portion. Then, the connector portions 112 are received inside the opening portion 76 when viewed from the vehicle front side and are exposed when viewed from the outside of the casing 62.

Additionally, the surface on the vehicle upper side of the casing 110 is provided with a "plurality of fin portions 114" which is a heat dissipation portion and the fin portions 114 are formed in a plate shape protruding from the surface toward the vehicle upper side and extending in the width direction of the vehicle. Furthermore, the fin portions 114 are disposed at intervals in the front to rear direction of the vehicle.

Further, the converter 68 is electrically connected to the sub-battery 66 and the electronic device included in the autonomous driving device module 60 and is able to convert a voltage of a current input from the sub-battery 66 into a voltage corresponding to the electronic device.

Next, a configuration of the blower 70 will be described. The blower 70 includes a casing 116 which constitutes an outer shell thereof and a runner and a motor (not illustrated) which are accommodated inside the casing 116. This blower 70 is attached to the extension wall portion 72B7 of the casing 62 by an attachment member (not illustrated) and a portion of about a half including a "blowing port 116A" of the casing 116 is accommodated in the casing 62.

Further, a portion on the vehicle lower side of the blower 70 is provided with an intake port (not illustrated) and the blower 70 is disposed so that the intake port and the through-hole 82 overlap each other when viewed from the up and down direction of the vehicle. Then, the cooling air W blown out from the blower 70 is blown, as illustrated in FIGS. 1 to 3, toward the sub-battery 66, the autonomous driving control unit 64, and the converter 68 and is discharged from the exhaust port 80 of the casing 62. That is, the blowing port 116A of the blower 70 is disposed on one side of the casing 62 in the long direction and is able to blow air toward the other side of the casing 62 in the long direction. Furthermore, the blower 70 may not be configured to blow air toward all of the sub-battery 66, the autonomous driving control unit 64, and the converter 68 and may be configured to blow air to at least one of them.

Here, in this embodiment, a "flow passage 118" of the cooling air W is formed from the blowing port 116A to the exhaust port 80 by the front wall portion 72B1 and the rear wall portion 72B2 of the casing 62, the casing 92 of the altitude map information ECU 86, the casing 96 of the autonomous driving control ECU 88, the casing 102 of the driver monitor 90, and the casing 110 of the converter 68.

That is, this flow passage 118 extends to pass through the casing 62 in the width direction of the vehicle and the fin portions 100 and 114 protrude toward the flow passage 118 and extend along the flow passage 118.

Next, operations and effects of the embodiment will be described.

Figure 5:
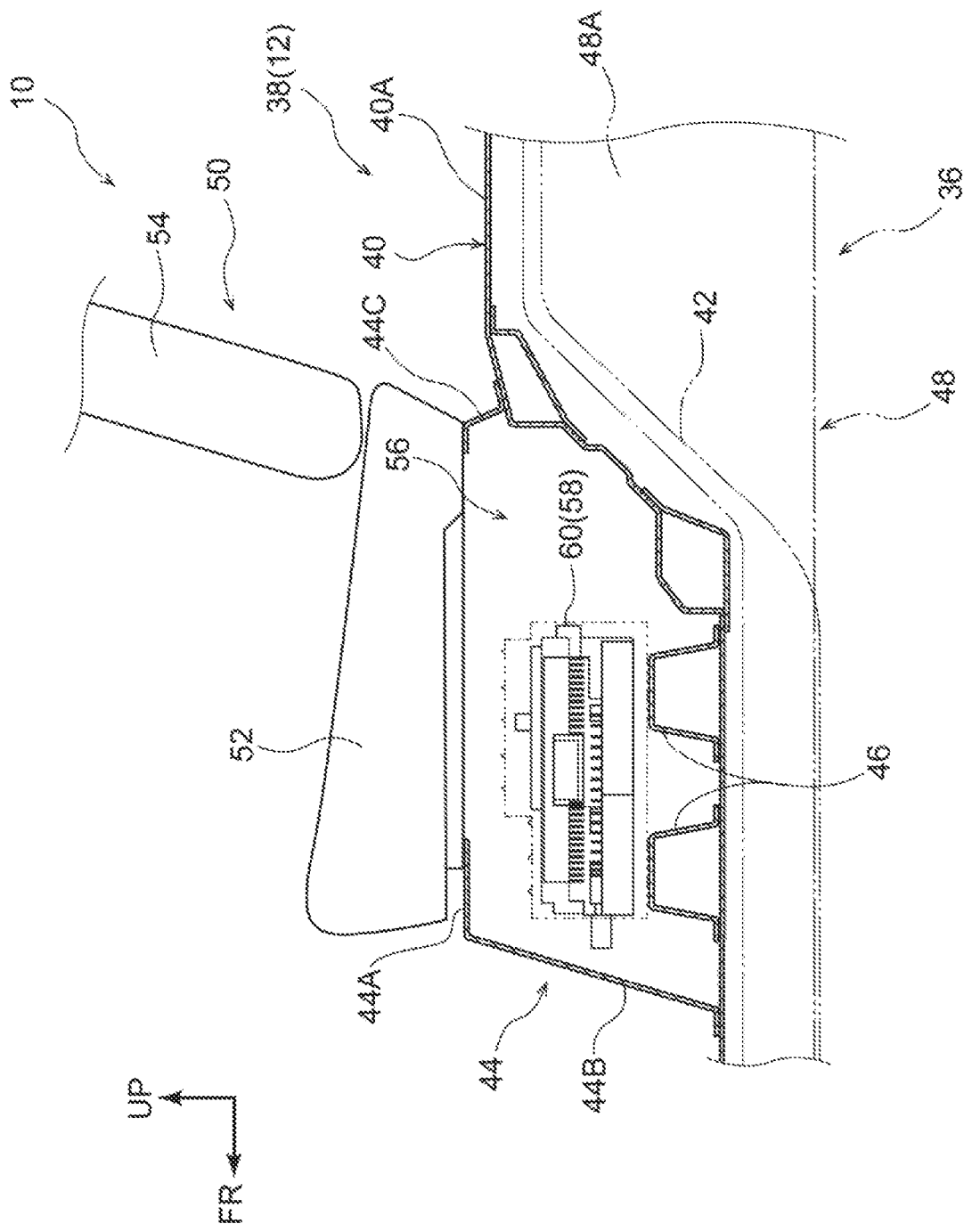
FIG. 5 is a cross-sectional view illustrating, the configuration in the vicinity of the autonomous driving device module of the vehicle that adopts the autonomous driving device module mounting structure according to the embodiment when viewed from the outside in the width direction of the vehicle.

In this embodiment, as illustrated in FIG. 5, the autonomous driving device module 60 obtained by integrating the plurality of devices is provided and the autonomous driving of the vehicle 10 can be performed by the autonomous driving device module 60.

Incidentally, in order to install the autonomous driving device module 60 in an existing vehicle, a space for disposing the autonomous driving device module 60 needs to be secured. Then, as the space which can be used to dispose the autonomous driving device module 60, a space which can be freely used by a passenger in the existing vehicle such as a luggage space can be exemplified. However, when the space which can be freely used by the passenger is decreased in size, the convenience of the vehicle is impaired.

Here, in this embodiment, the rear seat 50 on which a passenger can sit is disposed on the vehicle upper side of the floor panel 40 constituting a part of the vehicle body 12 and extending in the front to rear direction of the vehicle and the width direction of the vehicle so that a gap is formed with respect to the floor panel 40. For this reason, in this embodiment, a space on the vehicle upper side of the floor panel 40 and the vehicle lower side of the rear seat 50 is secured.

Then, the autonomous driving device module 60 is disposed in the space (the chamber 56) between the floor panel 40 and the rear seat 50 and in this embodiment, the autonomous driving device module 60 can be mounted on the vehicle 10 without sacrificing the space which can be freely used by the passenger. Thus, in this embodiment, it is possible to mount a device constituting the autonomous driving device 58 while securing the space which can be freely used by the passenger.

Further, in this embodiment, as illustrated in FIG. 4, the autonomous driving device module 60 includes the autonomous driving control unit 64 and the movement of the vehicle 10 in the autonomous driving mode can be controlled by the autonomous driving control unit 64. Further, the autonomous driving device module 60 includes the sub-battery 66 and the converter 68. Accordingly, even in a state in which power cannot be supplied from the main, battery 36 provided in the vehicle 10 to the autonomous driving control unit 64, power supplied from the sub-battery 66 is converted by the converter 68 so as to be supplied to the autonomous driving control unit 64 and is supplied to the autonomous driving control unit 64.

Additionally the autonomous driving device module 60 includes the blower 70 and the cooling air W is blown from the blower 70 toward the autonomous driving control unit 64, the sub-battery 66, and the converter 68 so as to cool them. Accordingly, it is possible to suppress an extreme increase in temperature of the autonomous driving control unit 64, the sub-battery 66, and the converter 68 during the operation. Thus, in this embodiment, the autonomous driving device 58 can be operated in a stable state.

Further, in this embodiment, the autonomous driving device module 60 includes the casing 62 and the casing 62 accommodates a part of the autonomous driving control unit 64, the sub-battery 66, the converter 68, and the blower 70.

Then, the blowing port 116A of the blower 70 is disposed on one side of the casing 62 in the long direction inside the casing 62 and the blowing port 116A is able to blow air toward the other side of the casing 62 in the long direction. Meanwhile, the exhaust port 80 is provided in a portion on the other side of the casing 62 in the long direction in the peripheral wall portion 72B of the casing 62. For this reason, the cooling air W blown out from the blower 70 can pass straight through the casing 62 and hence the staying of the cooling air W inside the casing 62 can be suppressed. Thus, in this embodiment, it is possible to improve the cooling efficiency of the device constituting the autonomous driving device 58.

Further, in this embodiment, the autonomous driving control unit 64 includes the altitude map information ECU 86 and the autonomous driving control ECU 88 and in the autonomous driving control ECU 88, the position of the vehicle 10 can be estimated based on the man information stored in the altitude map information ECU 86 and the signal transmitted from a locator camera or LIDAR capable of acquiring the peripheral situation of the vehicle 10 (the own vehicle).

Further, the autonomous driving control unit 64 includes the driver monitor 90 and the driver monitor 90 can estimate the driver state based on the signal transmitted from the CCD camera capable of monitoring the state of the driver sitting on the driver seat. Thus, in this embodiment, it is possible to improve the accuracy of the autonomous driving and to reflect the driver state in the control using the autonomous driving device 58.

Further, in this embodiment, the casing 62 is disposed in the space on the vehicle upper side of the floor panel 40 and the vehicle lower side of the rear seat 50 with the width direction of the vehicle as the long direction.

Incidentally, since the rear seat of the vehicle tends to have a configuration in which a plurality of seat cushions is disposed adjacently in the seat width direction there is a tendency that the space on the vehicle upper side of the floor panel 40 and the vehicle lower side of the rear seat 50 increases in size in the width direction of the vehicle.

Here, in this embodiment, since the casing 62 is disposed as described above, it is easy to secure a space on one side in the width direction of the vehicle and the other side in the width direction of the vehicle of the casing 62 as compared with a configuration in which the casing 62 is disposed with the front to rear direction of the vehicle as the long direction. For this reason, it is possible to smoothly suck air by the blower 70 and to discharge air from the exhaust port 80.

Incidentally, in a case in which power is supplied to the altitude map information ECU 86, the autonomous driving control ECU 88, and the driver monitor 90 or a signal is transmitted and received between these components, the casing 62 may be provided so that various wirings or devices connected thereto are connectable.

Meanwhile, when an opening portion for connecting a wiring or device is provided at both sides in the front to rear direction of the vehicle of the peripheral wall portion 72B of the casing 62, it is troublesome to connect a wiring or device to the altitude map information ECU 86, the autonomous driving control ECU 88, and the driver monitor 90.

Here, in this embodiment, the connector portions 94 and 98 provided in one disposed adjacently to the exhaust port 80 among the altitude map information ECU 86, the autonomous driving control ECU 88, and the driver monitor 90 are disposed so that a wiring or device is connectable from the exhaust port 80. Further, in this embodiment, the opening portions 76 and 78 are provided in a portion on one side in the front to rear direction of the vehicle of the peripheral wall portion 72B of the casing 62 and the connector portions 104 and 112 provided in one disposed adjacently to the opening portions 76 and 78 among the altitude map information ECU 86, the autonomous driving control ECU 88, and the driver monitor 90 are disposed so that a wiring or device is connectable from the opening portions 76 and 78.

For this reason, as compared with a configuration in which the opening portion is provided at both sides of the peripheral wall portion 72B of the casing 62 in the front to rear direction of the vehicle, it is possible to simplify a connection portion of the wiring or device with respect to the altitude map information ECU 86, the autonomous driving control ECU 88, and the driver monitor 90. Thus, in this embodiment, it is possible to improve the efficiency of the installation operation of the device constituting the autonomous driving device 58 while improving the cooling efficiency thereof.

Further, in this embodiment, the altitude map information ECU 86, the autonomous driving control ECU 88, the driver monitor 90, and the converter 68 respectively include the casings 92, 96, 102, and 110 constituting outer shells thereof. Then, the flow passage 118 of the cooling air W is formed from the blowing port 116A of the blower 70 to the exhaust port 80 by the peripheral wall portion 72B of the casing 62 and the casings 92, 96, 102, and 110. For this reason, the cooling air W can be applied to each of the altitude map information ECU 86, the autonomous driving control ECU 88, the driver monitor 90, and the converter 68 without disposing a duct inside the casing 62 and the cooling air W can be smoothly blown through the casing 62.

Therefore, in this embodiment, it is possible to simplify the configuration of the autonomous driving device 58 while improving the cooling efficiency of the device constituting the autonomous driving device 58.

Further, in this embodiment, the casings 96 and 110 are provided with the fin portions 100 and 114 which protrude toward the flow passage 118 of the cooling air W blown out from the blower 70 and the surface areas of the casings 96 and 110 at the side of the flow passage 118 in the casings 96 and 110 can be increased. For this reason, the heat dissipation amount from the casings 96 and 110 to the cooling air W blown out from the blower 70 can be increased. Further, since the fin portions 100 and 114 extend along the flow passage 118, it is possible to prevent the fin portions 100 and 114 from serving as a resistance against the cooling air W. Thus, in this embodiment, it is possible to further improve the cooling efficiency of the device constituting the autonomous driving device 58.

Additionally, in this embodiment, the main battery 36 provided separately from the autonomous driving device module 60 is provided. When power is supplied from the main battery 36 to the power unit 28 and the autonomous driving device module 60, these components are driven so that the autonomous driving of the vehicle 10 can be performed. Additionally, the main battery 36 is disposed on the vehicle lower side of the floor panel 40 and in this embodiment, the main battery 36 can be mounted on the vehicle 10 without sacrificing the luggage space.

(1) In the above-described embodiment, the altitude map information ECU 86, the autonomous driving control ECU 88, and the driver monitor 90 constituting the autonomous driving control unit 64 are separated from one another, but the altitude map information ECU 86, the autonomous driving control ECU 88, and the driver monitor 90 may be integrated with one another in response to the configuration and the like of the casing 62.

(2) Further, in the above-described embodiment, the autonomous driving device module 60 is disposed with the long direction as the width direction of the vehicle, but the autonomous driving device module 60 may be disposed with the long direction as the front to rear direction of the vehicle in response to the size and the like of the autonomous driving device module 60. Additionally, the shape of the casing 62 can be also various shapes including an oval shape when viewed from the up and down direction of the vehicle in response to the specification of the vehicle 10 or the configuration of the device accommodated therein. In addition, the autonomous driving device module 60 may use a support member supporting the autonomous driving control ECU 88 and a base plate instead of the casing 62 in response to the configuration and the like of the vehicle 10.

(3) Further, in the above-described embodiment, the autonomous driving control ECU 88 and the converter 68 are provided with the fin portion, but the fin portion may be provided in the casings of the other devices in response to a heat dissipation amount and the like. Additionally, when the heat dissipation amount of the device constituting the autonomous driving device module 60 is small, the fin portion may not be provided in the casing of that device.

(4) Further, in the above-described embodiment, the flow passage 118 is formed by the casings 92, 96, 102, and 110 of the altitude map information ECU 86, the autonomous driving, control ECU 88, the driver monitor 90, and the converter 68, but this disclosure is not limited thereto. For example, the flow passage of the cooling air W may be formed by disposing a duct inside the casing 62 in response to the arrangement and the like of the device constituting the autonomous driving device module 60.

(5) Additionally, in the above-described embodiment, the driver monitor 90 estimates the driver state based on the signal transmitted from the CCD camera, but this disclosure is not limited thereto. For example, a sphygmomanometer capable of measuring a driver's blood pressure may be connected to the driver monitor 90 and the driver monitor 90 may estimate, a driver's health state (a state on whether the driver can drive the vehicle 10) based on a signal transmitted from the sphygmomanometer.

What is claimed is:

1. An autonomous driving device module mounting structure comprising:
    a floor panel that constitutes a part of a vehicle body and extends in a front to rear direction of a vehicle and a width direction of the vehicle;
    a rear seat that is disposed on a vehicle upper side of the floor panel such that a gap is formed with respect to the floor panel;
    an autonomous driving device module that is equipped with a plurality of devices and is disposed on the vehicle upper side of the floor panel and a vehicle lower side of the rear seat, the plurality of devices including an autonomous driving electronic control unit, a sub-battery, a converter, and an air blowing unit, and an outer casing portion accommodating the autonomous driving electronic control unit, the sub-battery, the converter, and a blowing port of the air blowing unit; and
    the outer casing portion including a peripheral wall portion provided with a plurality of protrusion portions protruding from an outer surface of the peripheral wall portion, extending in an up and down direction of the vehicle between an upper end of the peripheral wall portion and a lower end of the peripheral wall portion.

2. The autonomous driving device module mounting structure according to claim 1, wherein
    the autonomous driving electronic control unit is configured to control a movement of the vehicle in an autonomous driving mode,
    the sub-battery is provided separately from a main battery provided in the vehicle and is configured to supply power to the autonomous driving electronic control unit,
    the converter is configured to convert power supplied from the sub-battery and to supply the power to the autonomous driving electronic control unit, and
    the air blowing unit is configured to blow cooling air toward at least one of the autonomous driving electronic control unit, the sub-battery, and the converter.

3. The autonomous driving device module mounting structure according to claim 2, wherein
    the outer casing portion is disposed with one direction as a long direction,
    the blowing port of the air blowing unit is disposed on one side of the outer casing portion in the long direction inside the outer casing portion and is opened to the other side of the outer casing portion in the long direction, and a portion on the other side of a peripheral wall portion of the outer casing portion in the long direction is provided with an exhaust port.

4. The autonomous driving device module mounting structure according to claim 2, wherein the autonomous driving electronic control unit includes
an altitude map information electronic control unit,
an own position estimation electronic control unit, and
a driver state estimation electronic control unit, the altitude map information electronic control unit is configured to store map information, the own position estimation electronic control unit is configured to estimate a position of an own vehicle on the basis of the map information and a signal transmitted from a peripheral situation acquisition unit capable of acquiring a peripheral situation of the own vehicle, and the driver state estimation electronic control unit is configured to estimate a driver state on the basis of a signal transmitted from a camera configured to monitor a state of a driver sitting on a driver seat.

5. The autonomous driving device module mounting structure according to claim 3, wherein the autonomous driving electronic control unit includes
an altitude map information electronic control unit,
an own position estimation electronic control unit, and
a driver state estimation electronic control unit, the altitude map information electronic control unit is configured to store map information, the own position estimation electronic control unit is configured to estimate a position of an own vehicle on the basis of the map information and a signal transmitted from a peripheral situation acquisition unit capable of acquiring a peripheral situation of the own vehicle, and the driver state estimation electronic control unit is configured to estimate a driver state on the basis of a signal transmitted from a camera configured to monitor a state of a driver sitting on a driver seat.

6. The autonomous driving device module mounting structure according to claim 5, wherein the outer casing portion is disposed with the width direction of the vehicle as a long direction, an exhaust port side connector portion that is provided in one disposed adjacently to the exhaust port among the altitude map information electronic control unit, the own position estimation electronic control unit, and the driver state estimation electronic control unit is disposed so that a wiring or device is connectable from an exhaust port side, and an opening side connector portion that is provided in one disposed adjacently to an opening portion provided in a portion on one side of the peripheral wall portion in the front to rear direction of the vehicle among the altitude map information electronic control unit, the own position estimation electronic control unit, and the driver state estimation electronic control unit is disposed so that a wiring or device is connectable from an opening portion side.

7. The autonomous driving device module mounting structure according to claim 5, wherein each of the altitude map information electronic control unit, the own position estimation electronic control unit, the driver state estimation electronic control unit, and the converter includes an inner casing portion constituting an outer shell, and a flow passage of cooling air blown out from the air blowing unit is formed from the blowing port to the exhaust port by the peripheral wall portion and the inner casing portion.

8. The autonomous driving device module mounting structure according to claim 7, wherein the inner casing portion is provided with a heat dissipation portion that protrudes toward the flow passage and extends along the flow passage.

9. An autonomous driving electric vehicle comprising:

a floor panel that constitutes a part of a vehicle body and extends in a front to rear direction of a vehicle and a width direction of the vehicle;

a rear seat that is disposed on a vehicle upper side of the floor panel so that a gap is formed with respect to the floor panel and on which a passenger is able to sit;

an autonomous driving device module that is equipped with a plurality of devices and is disposed on the vehicle upper side of the floor panel and a vehicle lower side of the rear seat;

a main battery that is configured to supply power to a power unit and the autonomous driving device module, is provided separately from the autonomous driving device module, and is disposed on a vehicle lower side of the floor panel; and a pair of floorcross members extending in the width direction of the vehicle along a surface on the floor panel and within the gap, the autonomous driving device module disposed on the pair of floor cross members.

10. The autonomous driving electric vehicle according to claim 9, wherein the plurality of devices includes
an autonomous driving electronic control unit,
a sub-battery,
a converter, and
an air blowing unit, the autonomous driving electronic control unit is configured to control a movement of the vehicle in an autonomous driving mode, the sub-battery is provided separately from the main battery provided in the vehicle and is configured to supply power to the autonomous driving electronic control unit, the converter is configured to convert power supplied from the sub-battery and to supply the power to the autonomous driving electronic control unit, and the air blowing unit is configured to blow cooling air toward at least one of the autonomous driving electronic control unit, the sub-battery, and the converter.

11. The autonomous driving electric vehicle according to claim 10, wherein the autonomous driving device module includes an outer casing portion, the outer casing portion is able to accommodate the autonomous driving electronic control unit, the sub-battery, the converter, and a blowing port of the air blowing unit, the outer casing portion is disposed with one direction as a long direction, the blowing port of the air blowing unit is disposed on one side of the outer casing portion in the long direction inside the outer casing portion and is opened to the other side of the outer casing portion in the long direction, and a portion on the other side of a peripheral wall portion of the outer casing portion in the long direction is provided with an exhaust port.

12. The autonomous driving electric vehicle according to claim 10, wherein
the autonomous driving electronic control unit includes
an altitude map information electronic control unit,
an own position estimation electronic control unit, and
a driver state estimation electronic control unit,
the altitude map information electronic control unit is configured to store map information,
the own position estimation electronic control unit is configured to estimate a position of an own vehicle on the basis of the map information and a signal transmitted from a peripheral situation acquisition unit capable of acquiring a peripheral situation of the own vehicle, and
the driver state estimation electronic control unit is configured to estimate a driver state on the basis of a signal transmitted from a camera configured to monitor a state of a driver sitting on a driver seat.

13. The autonomous driving electric vehicle according to claim 11, wherein
the autonomous driving electronic control unit includes
an altitude map information electronic control unit,
an own position estimation electronic control unit, and
a driver state estimation electronic control unit,
the altitude map information electronic control unit is configured to store map information,
the own position estimation electronic control unit is configured to estimate a position of an own vehicle on the basis of the map information and a signal transmitted from a peripheral situation acquisition unit capable of acquiring a peripheral situation of the own vehicle, and
the driver state estimation electronic control unit is configured to estimate a driver state on the basis of a signal transmitted from a camera configured to monitor a state of a driver sitting on a driver seat.

14. The autonomous driving electric vehicle according to claim 13, wherein
the outer casing portion is disposed with the width direction of the vehicle as a long direction,
an exhaust port side connector portion that is provided in one disposed adjacently to the exhaust port among the altitude map information electronic control unit, the own position estimation electronic control unit, and the driver state estimation electronic control unit is disposed so that a wiring or device is connectable from an exhaust port side, and
an opening side connector portion that is provided in one disposed adjacently to an opening portion provided in a portion on one side of the peripheral wall portion in the front to rear direction of the vehicle among the altitude map information electronic control unit, the own position estimation electronic control unit, and the driver state estimation electronic control unit is disposed so that a wiring or device is connectable from an opening portion side.

15. The autonomous driving electric vehicle according to claim 13, wherein
each of the altitude map information electronic control unit, the own position estimation electronic control unit, the driver state estimation electronic control unit, and the converter includes an inner casing portion constituting an outer shell, and
a flow passage of cooling air blown out from the air blowing unit is formed from the blowing port to the exhaust port by the peripheral wall portion and the inner casing portion.

16. The autonomous driving electric vehicle according to claim 15, wherein
the inner casing portion is provided with a heat dissipation portion that protrudes toward the flow passage and extends along the flow passage.

17. The autonomous driving electric vehicle according to claim 9, wherein the floor panel extends between the main battery and the rear seat.

* * * * *